United States Patent
Inoue

(10) Patent No.: US 6,987,537 B2
(45) Date of Patent: Jan. 17, 2006

(54) IMAGE PICKUP SYSTEM WITH MOS SENSORS AND MICROLENSES

(75) Inventor: Ikuko Inoue, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 755 days.

(21) Appl. No.: 09/824,774

(22) Filed: Apr. 4, 2001

(65) Prior Publication Data

US 2001/0030703 A1 Oct. 18, 2001

(30) Foreign Application Priority Data

Apr. 12, 2000 (JP) .............................. 2000-110915

(51) Int. Cl.
*H04N 5/335* (2006.01)
(52) U.S. Cl. ..................... 348/308; 348/294; 348/335; 257/291
(58) Field of Classification Search ................ 348/308, 348/340, 294, 335; 438/69, 70; 257/294, 257/292, 291, 293, 432, 433, 448
See application file for complete search history.

(56) References Cited

U.S. PATENT DOCUMENTS 6,211,509 B1 * 4/2001 Inoue et al. ............. 250/208.1

2004/0140564 A1 * 7/2004 Lee et al. ................... 257/758

FOREIGN PATENT DOCUMENTS

| JP | 2000-150846 | * | 2/2000 |
| JP | 2000-150846 | | 5/2000 |

* cited by examiner

*Primary Examiner*—David L. Ometz
*Assistant Examiner*—Heather R. Long
(74) *Attorney, Agent, or Firm*—Oblon, Spivak, McClelland, Maier & Neustadt, P.C.

(57) ABSTRACT

The image pickup system includes: MOS sensors arranged in an image pickup region of a semiconductor substrate in the form of a matrix and having photoelectric transfer layers; a peripheral circuit part formed in a region of the semiconductor substrate except for the image pickup region and having a driving circuit for driving the MOS sensors and a signal processing circuit for processing output signals from the MOS sensors; and microlenses, formed on the photoelectric transfer layers via a first insulating film, for condensing picture signals on the photoelectric transfer layers, wherein the driving circuit and the signal processing circuit in the peripheral circuit part are covered by a second insulating film, and the distance between the surface of the first insulating film and the semiconductor substrate is shorter than the distance between the surface of a second insulating film and the semiconductor substrate.

5 Claims, 10 Drawing Sheets

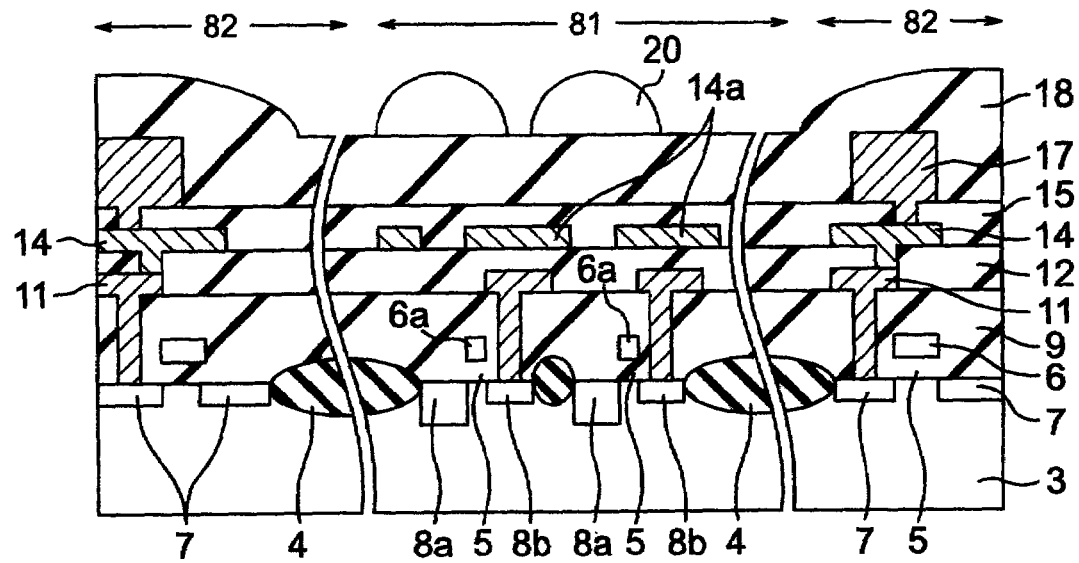
F I G. 1
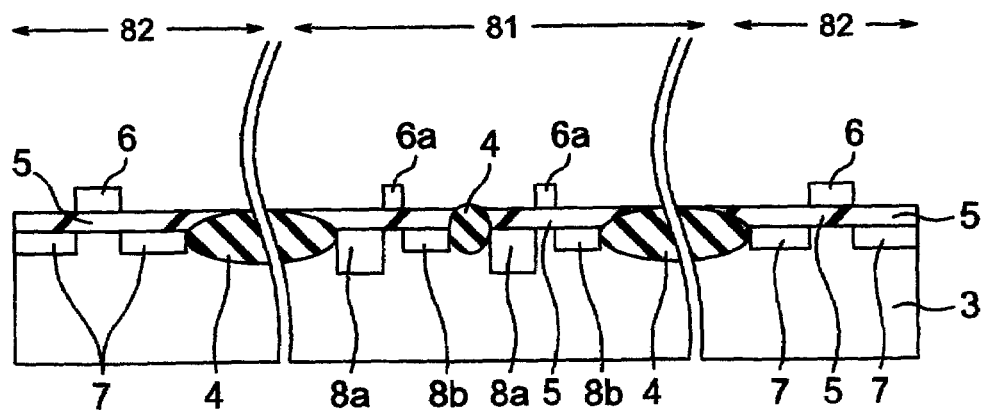
F I G. 2

IMAGE PICKUP SYSTEM WITH MOS SENSORS AND MICROLENSES

CROSS REFERENCE TO RELATED APPLICATION

This application claims benefit of priority under 35USC § 119 to Japanese Patent Application No. 2000-110915, filed on Apr. 12, 2000, the contents of which are incorporated by reference herein.

BACKGROUND OF THE INVENTION

1. Field of the Invention

The present invention relates generally to an image pickup system having a solid state image sensor device.

2. Description of Related Art

In recent years, MOS solid stage image pickup elements are widely noticed since there are advantages in that required voltages and costs are low and only one power supply is required.

Since a signal processing circuit for processing signals, which are outputted from a solid stage image sensor device having MOS solid state image pickup elements, comprises MOS transistors, the solid state image sensor device can be fabricated in the same fabricating process as a process for fabricating the signal processing circuit and can be formed on the same substrate as the signal processing circuit. For example, as shown in FIG. 15, as an example of an image pickup system having a MOS solid state image sensor device, a video camera 60 comprises: a MOS sensor 61, which is an image pickup element; an automatic gain control system (which will be also hereinafter referred to as an "AGC circuit") 62 for adjusting the level of a voltage signal; a clamping circuit (which will be also hereinafter referred to as a "CLP circuit") 63 for clamping the voltage signal; an AD converting circuit 64 for converting an analog signal into a digital signal; a timing control circuit 65 for generating a clock pulse to control the timing in the image pickup system 60; a timing generator/signal generator circuit (which will be also hereinafter referred to as a TG/SG circuit) 66 for generating a timing signal and driving control signal for driving and controlling the MOS sensor 61 in synchronism with the clock pulse; a DSP circuit 67 for processing the digital signal which is the output of the AD converting circuit; an encoder circuit 68 for encoding the output of the DSP circuit 67; an output circuit 69 for outputting the encoded signal; and a DA converting circuit 70 for converting the output of the output circuit 69 into an analog signal.

A picture voltage signal photoelectric-transferred by the MOS sensor 61 is level-controlled by the AGC circuit 62 to be clamped by the CLP circuit to be fed to the AD converting circuit 64. Then, the picture voltage signal is converted by the AD converting circuit 64 into a digital picture signal having one sample value of, e.g., 8 bits, to be fed to the DSP circuit 67. For example, the DSP circuit 67 comprises a color separating circuit, a clamping circuit, a gamma control circuit, a white control circuit, a black control circuit, a knee circuit, a color balancing circuit and so forth. The DSP circuit 67 carries out a required signal processing with respect to the supplied digital picture signal. Then, the signal processed by the DSP circuit 67 is fed to the encoder circuit 68. The encoder circuit 68 decodes the fed picture signal to convert it into a luminance signal and a color-difference signal. The MOS sensor 61 is timing-controlled by a timing signal and driving control signal which are fed from the TG/SG circuit 66. Thereafter, the decoded picture signal is supplied to the DA converting circuit 70 via the output circuit 69 to be converted into an analog video signal to be outputted to the outside.

In the above described image pickup system, only the image pickup region of the MOS sensor 61 has the function of converting a picture light signal into a signal charge. In other circuits than the MOS sensor 61, high density integration and speed characteristics are regarded as important. In order to improve high density integration and speed characteristics, it is required to carry out multilayering.

On the other hand, in the image pickup region of the MOS sensor 61 for handling light, there are generally formed microlenses for condensing light on the upper portion of the image pickup system. The point is whether the distance between the microlens and a photoelectric transfer region, which is formed on a semiconductor substrate and in which the photoelectric transfer is carried out, is coincident with the focal length of the microlens. That is, even if the signal processing circuit around the MOS sensor 61 is multilayered to improve high density integration and speed characteristics, the distance between the photoelectric transfer region and the microlens must be coincident with the focal length of the microlens. In addition, if an Al wiring serving as a shading layer in the photoelectric transfer region is closer to the semiconductor substrate, it prevents the incidence of irregular reflection due to shading.

In the conventional image pickup system including the MOS solid state image sensor device, image pickup characteristics are regarded as important, so that peripheral circuits in the image pickup region are not multilayered. For that reason, there is a problem in that the high density integration and accelerating of the peripheral circuits have not been realized.

When the operation of the peripheral circuits is accelerated or when circuits (including the MOS sensor) formed on the same substrate are formed of a multi layer metallization in order to facilitate design, it is difficult to condense light in the photoelectric transfer region, so that image pickup characteristics deteriorate.

Referring to FIGS. 16 and 17, these problems will be described below.

FIG. 16 is a sectional view of an image pickup system taken along line X–X' of FIG. 15. In the image pickup system shown in FIG. 16, image pickup characteristics are regarded as important. In this image pickup system, photoelectric transfer layers 27a for converting picture light signals 40 into picture electric signals and diffusion layers 27b are formed in an image pickup region 81 of a semiconductor substrate 23 on which MOS sensors 61 are to be formed. On the top of the semiconductor substrate 23 between the photoelectric transfer layers 27a and the diffusion layers 27b, gate electrodes 25a are formed via a gate insulating film. The gate electrode 25a, the photoelectric transfer layer 27a and the diffusion layer 27b constitute the MOS transistor 61. Furthermore, the photoelectric transfer layers 27a are arranged in the image pickup region 81 in the form of a matrix. Each of the diffusion layers 27b is connected to a first Al wiring 28 via a contact provided in an interlayer dielectric film 31. Therefore, the picture electric signal converted by the photoelectric transfer layer 27a is fed to the first Al wiring 28.

In addition, shading films 29a of Al are formed in the image pickup region 81 except for the photoelectric transfer layers 27a. On the top of the interlayer dielectric film 31 directly above the photoelectric transfer layers 27a, microlenses 32 for condensing the picture light signal 40 are provided.

On the other hand, on the top of the semiconductor substrate 23 in a peripheral circuit region 82 which is element-isolated from the image pickup region 81 by element isolating regions 24 of an insulating material, MOS transistors constituting the above described circuit are formed. Each of these MOS transistors comprises a source region and drain region 26, which are formed of diffusion layers formed in the semiconductor substrate 23, and a gate electrode 25 which is formed on the semiconductor substrate 23 via the gate insulating film between the source region 26 and the drain region 26. One of the source region 26 and the drain region 26 is connected to the first Al wiring 28 via a contact provided in the interlayer dielectric film 31. The first Al wiring 28 is connected to a second Al wiring 29 via a contact provided in the interlayer dielectric film. Furthermore, the second Al wiring 29 and the shading film 29a are formed in the same layer.

In this image pickup system shown in FIG. 16, in order to allow the picture light signal 40 condensed by the microlens 32 to easily form an image on the photoelectric transfer layer 27a, a double-layer wiring structure is formed in the image pickup region 81 and the peripheral circuit region 82, and the second Al wiring 29 and the shading film 29a are thinned to decrease the distance between the photoelectric transfer layer 27a and the microlens 32 so that the distance is substantially coincident with the focal length of the microlens 32. For that reason, the high density integration and accelerating of circuits formed in the peripheral circuit region 82 are lowered.

In order to prevent the lowering of the high density integration and accelerating, there is an image pickup system shown in FIG. 17 wherein circuits formed in the peripheral circuit region 82 have a triple-layer wiring structure having first through third Al wiring layers 28, 29 and 30 and wherein the second Al wiring 29, the shading film 29a, which is formed in the same layer as the second Al wiring 29, and the third Al wiring 30 are thickened. However, in the image pickup system shown in FIG. 17, the distance between the photoelectric transfer layer 27a and the microlens 32 is longer than the focal length of the microlens 32, so that the picture light signal 40 is difficult to form an image on the photoelectric transfer layer 27a, thereby deteriorating image pickup characteristics.

SUMMARY OF THE INVENTION

It is therefore an object of the present invention to eliminate the aforementioned problems and to provide an image pickup system capable of obtaining good image pickup characteristics and of achieving high density integration and rapid operations.

In order to accomplish the aforementioned and other objects, according to one aspect of the present invention, an image pickup system comprises: MOS sensors which are arranged in an image pickup region of a semiconductor substrate in the form of a matrix and which have photoelectric transfer layers; a peripheral circuit part which is formed in a region of the semiconductor substrate except for the image pickup region and which has a driving circuit for driving the MOS sensors and a signal processing circuit for processing output signals from the MOS sensors; and microlenses, formed on the photoelectric transfer layers via a first insulating film, for condensing picture signals on the photoelectric transfer layers, wherein the driving circuit and the signal processing circuit in the peripheral circuit part are covered by a second insulating film, and the distance between the surface of the first insulating film and the semiconductor substrate is shorter than the distance between the surface of a second insulating film and the semiconductor substrate.

Preferably, the peripheral circuit part has at least first through third wiring layers which are stacked via an insulating film to form a multi layer metallization structure.

Furthermore, a shading layer is preferably formed in the image pickup region so as to be the same layer as the second wiring layer.

The shading layer preferably has a smaller thickness than that of the second wiring layer.

Preferably, the distance between each of the microlenses and a corresponding one of the photoelectric transfer layers is substantially equal to the focal length of the corresponding one of the microlenses.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a sectional view showing the construction of the first preferred embodiment of an image pickup system according to the present invention;

FIG. 2 is a sectional view showing a process for fabricating the first preferred embodiment of an image pickup system according to the present invention;

DESCRIPTION OF THE PREFERRED EMBODIMENTS

Figure 3:
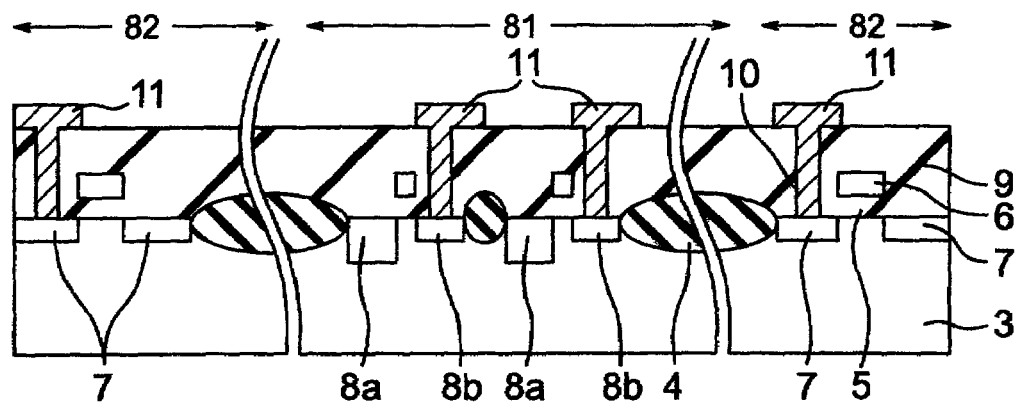
FIG. 3 is a sectional view showing a process for fabricating the first preferred embodiment of an image pickup system according to the present invention.

Referring now to the accompanying drawings, the preferred embodiments of the present invention will be described below.

(First Preferred Embodiment)

Referring to FIGS. 1 through 6, the first preferred embodiment of an image pickup system according to the present invention will be described below. FIG. 1 is a sectional view showing the construction of an image pickup system according to the present invention, and FIGS. 2 through 6 are sectional views showing a process for fabricating the image pickup system in this preferred embodiment.

In the image pickup system in this preferred embodiment, MOS sensors and their peripheral circuits are formed on the same chip. That is, as shown in FIG. 1, in the image pickup region 81 of a semiconductor substrate 3 on which MOS transistors are to be formed, there are formed photoelectric transfer layers 8a for converting picture light signals into picture electric signals, and diffusion layers 8b. On the semiconductor substrate between the photoelectric transfer layers 8a and the diffusion layers 8b, gate electrodes 6a are formed via a gate insulating film 5. The gate electrode 6a, the photoelectric transfer layer 8a and the diffusion layer 8b constitute a MOS transistor. Furthermore, the photoelectric transfer layers 8a are arranged in the image pickup region 81 in the form of a matrix.

Figure 15:
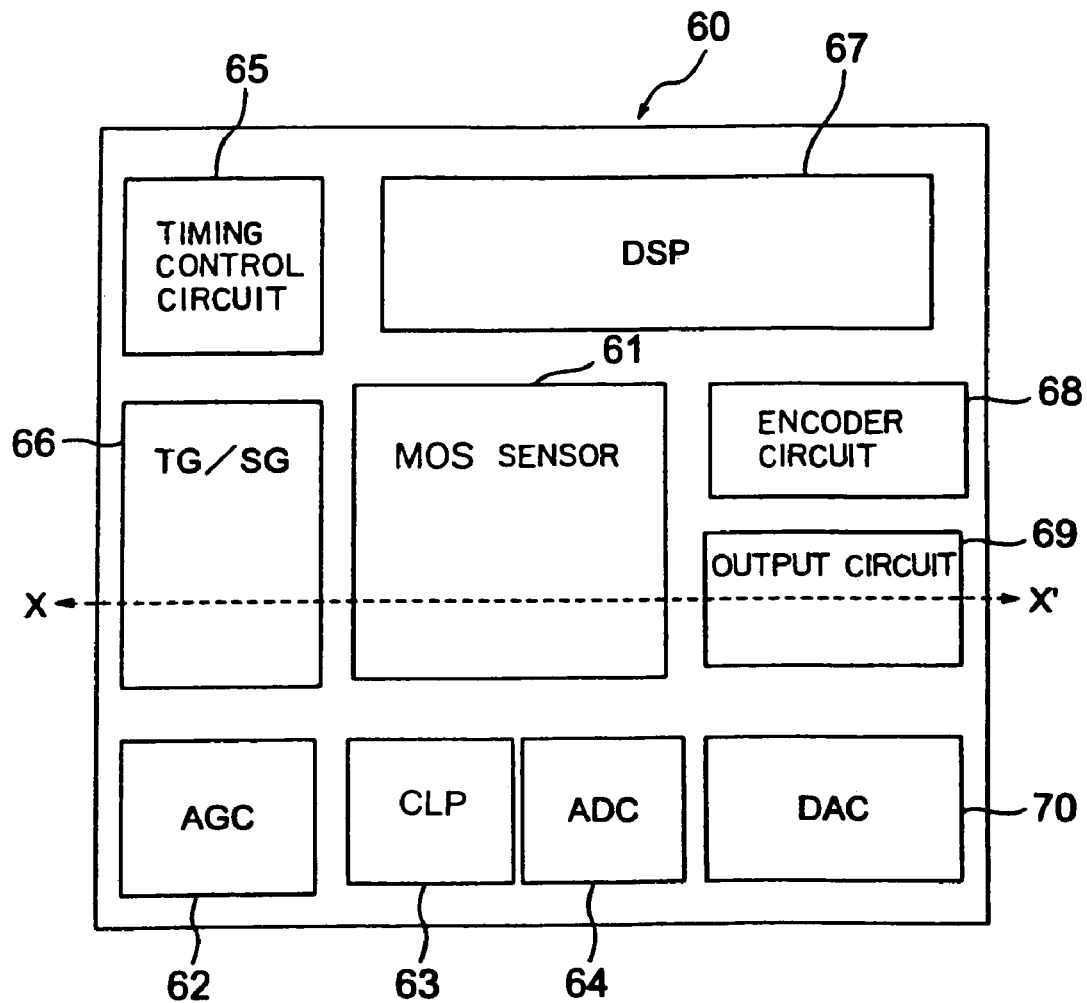
FIG. 15 is a plane view showing the construction of a conventional image pickup system.
Figure 16:
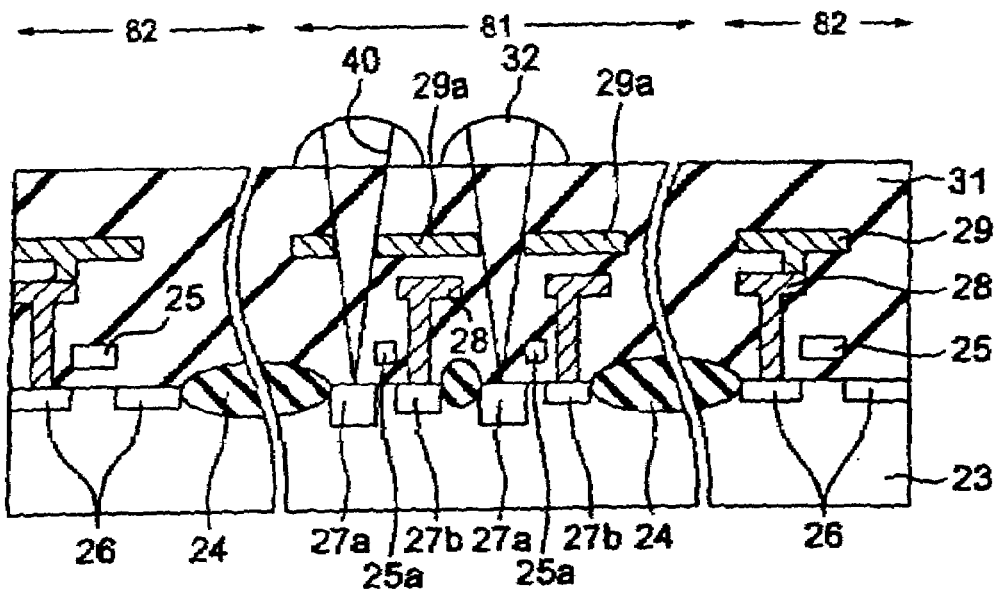
FIG. 16 is a sectional view showing the construction of a conventional image pickup system.
Figure 17:
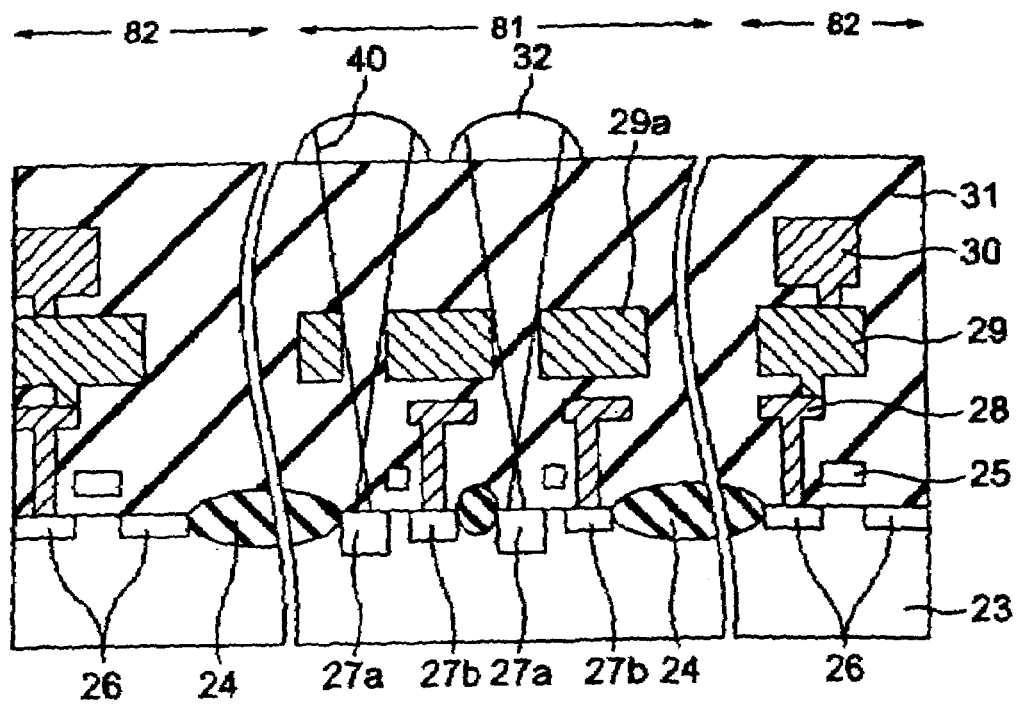
FIG. 17 is a sectional view showing the construction of a conventional image pickup system.

On the other hand, in the semiconductor substrate 3 in a peripheral circuit region 82 which is element-isolated from the image pickup region 81, MOS transistors constituting a peripheral circuit are formed. Furthermore, the peripheral circuit has the same construction as that described in, e.g., FIGS. 15 and 16. Each of these MOS transistors comprises a source region and drain region 7, which are formed of diffusion layers formed in the semiconductor substrate 3, and a gate electrode 6 which is formed on the semiconductor substrate 3 via the gate insulating film 5 between the source region and drain region 7. The gate electrodes 6, 6a, the source and drain regions 7, and the diffusion layers 8a, 8b are covered with an insulating film 9, the surface of which are flattened. On the surface of the flattened insulating film 9, first wiring layers 11 of, e.g., Al, are formed. Each of the first wiring layers 11 is connected to one of the source and drain regions 7 via a contact, which is provided in the insulating film 9, in the peripheral circuit region 82, and is connected to a corresponding one of the diffusion layers 8b via a contact, which is provided in the insulating film 9, in the image pickup region 81.

The first wiring layers 11 are covered with an insulating film 12, the surface of which is flattened. On the surface of the insulating film 12, shading films 14a, 14a of, e.g., Al, are formed in the image pickup region 81, and second wiring layers 14 of, e.g., Al, are formed in the peripheral circuit region 82. Furthermore, the shading films 14a and the second wiring layers 14 are formed so as to have a thickness of, e.g., 500 nm or less. Each of the second wiring layers 14 is connected to a corresponding one of the first wiring layers 11 via a contact provided in the insulating film 12.

The second wiring layers 14 and the shading films 14a are covered with an insulating film 15, the surface of which is flattened. On the surface of the insulating film 15, third wiring layers 17 of, e.g., Al, are formed in the peripheral circuit region 82. Each of the third wiring layers 17 is connected to a corresponding one of the second wiring layers 14 via a contact provided in the insulating film 15. In addition, an insulating film 18 is formed on the whole surface of the substrate so as to cover the third wiring layers 17. The surface of the insulating film 18 is flattened in the image pickup region 81. On the top of the flattened insulating film 18 in the image pickup region 81, microlenses 20 are provided so as to condense picture light signals on the photoelectric transfer layers 8a.

As described above, according to this preferred embodiment, since the surface of the insulating film 18 in the image pickup region 81, in which the microlenses 20 are formed, is flattened to have a lower level than that of the surface of the insulating film 18 in the peripheral circuit region 82, the picture light signals incident on the microlenses are easily condensed on the photoelectric transfer layers 8a, so that it is possible to obtain good image pickup characteristics. In addition, the peripheral circuit region 82 can have a wiring structure of three or more layers, so that it is possible to realize the high density integration and accelerating of the peripheral circuit. Moreover, since the second wiring layers 14 and shading films 14a of Al are formed so as to be thin, it is possible to inhibit hillock in the crystal growth of Al.

Referring to FIGS. 2 through 6, a method for fabricating an image pickup system in this preferred embodiment will be described below.

First, an element isolating region 4 of an insulating film is formed on a semiconductor substrate 3 of, e.g., silicon, to element-isolate an image pickup region 81 from a peripheral circuit region 82 to isolate elements in the respective regions (see FIG. 2). Thereafter, on the top of the semiconductor substrate in the image pickup region 81 and peripheral circuit region 82, a gate insulating film 5 is formed (see FIG. 2). Subsequently, gate electrodes 6 and 6a are formed on the gate insulating film 5 at desired positions (see FIG. 2). Subsequently, as shown in FIG. 2, source and drain regions 7 and diffusion layers 8a, 8b are formed by the ion implantation or the like.

Then, after an insulating film is deposited on the whole surface of the substrate, the surface thereof is flattened by the chemical mechanical polishing (CMP) to form a flattened insulating film 9 (see FIG. 3). Subsequently, after contact holes 10 communicated with one of each set of the source and drain regions 7 and the diffusion layers 8b are formed in the insulating film 9 using the lithography technique, Al is deposited on the whole surface of the substrate by, e.g., the sputtering method, so as to be filled in the contact holes 10, and patterned to form first wiring layers 11 (see FIG. 3).

Figure 4:
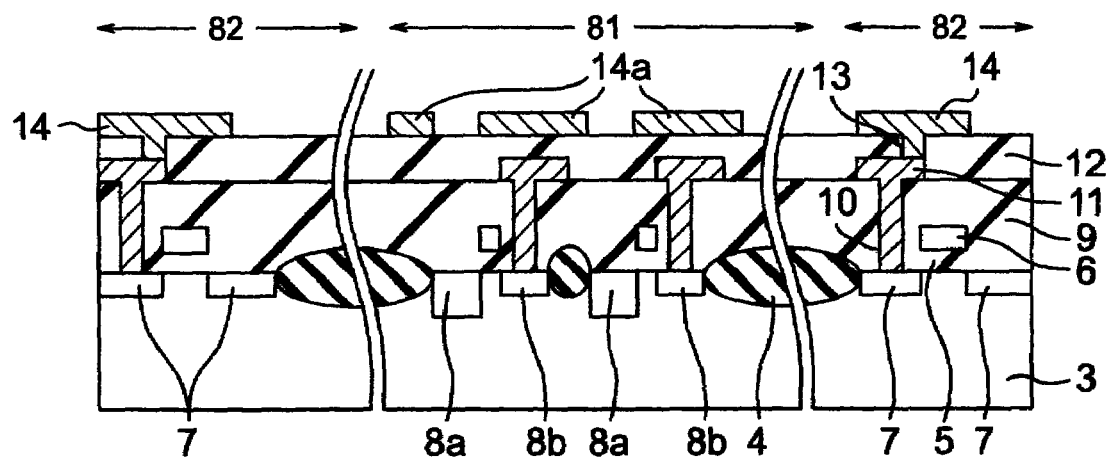
FIG. 4 is a sectional view showing a process for fabricating the first preferred embodiment of an image pickup system according to the present invention.

Then, as shown in FIG. 4, after an insulating film is deposited on the whole surface of the substrate, the surface thereof is flattened by the CMP to form a flattened insulating film 12. Subsequently, after contact holes 13 communicated with the first wiring layers 11 are formed in the insulating film 12 in the peripheral circuit region using the lithography technique, Al is deposited on the whole surface of the substrate so as to be filled in the contact holes 13, and patterned to form second wiring layers 14 and to form shading films 14a on the insulating film 12 in the image pickup region 81 (see FIG. 4).

Figure 5:
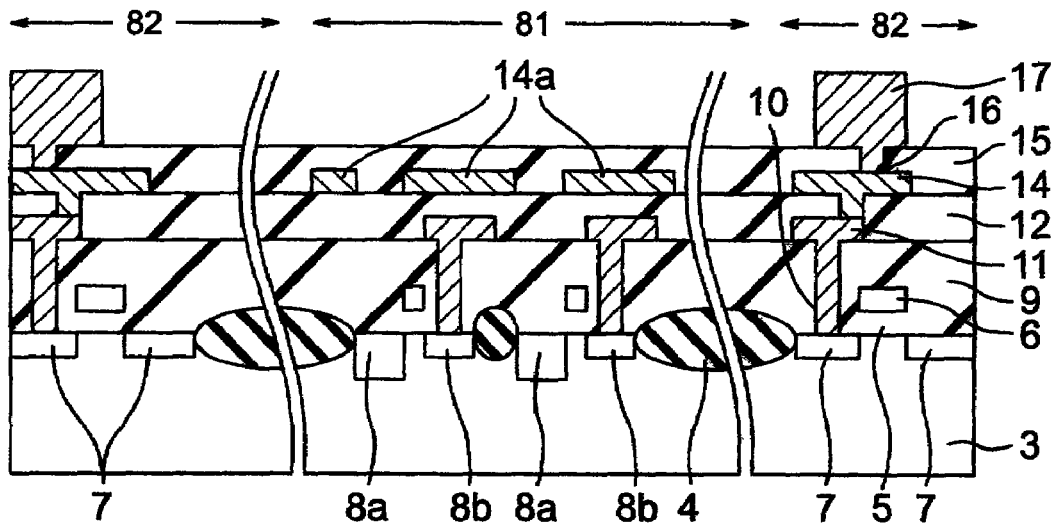
FIG. 5 is a sectional view showing a process for fabricating the first preferred embodiment of an image pickup system according to the present invention.
Figure 6:
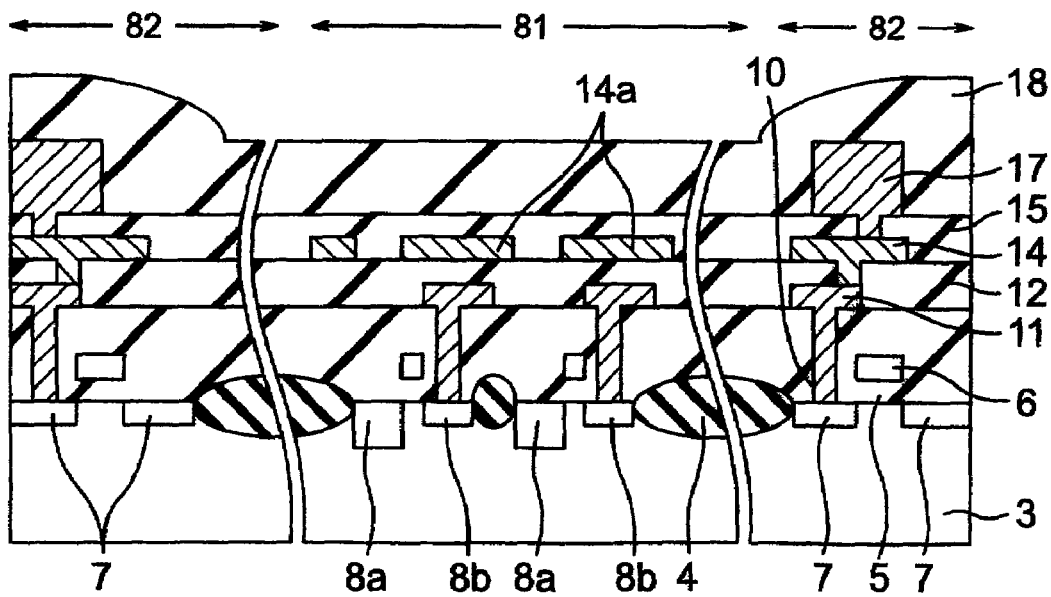
FIG. 6 is a sectional view showing a process for fabricating the first preferred embodiment of an image pickup system according to the present invention.

Then, after an insulating film is deposited on the whole surface of the substrate, the surface thereof is flattened by the CMP to form a flattened insulating film 15 (see FIG. 5). Subsequently, after contact holes 16 communicated with the second wiring layers 14 are formed in the insulating film 15 in the peripheral circuit region using the lithography technique, Al is deposited on the whole surface of the substrate so as to be filled in the contact holes 16, and patterned to form third wiring layers 17 (see FIG. 5).

Then, a film 18 of, e.g., boron phosphorus silicate glass (BPSG), is deposited on the whole surface of the substrate. Then, the BPSG film 18 in the image pickup region 81 is flattened, and the height thereof is lower than that of the BPSG film 18 in the peripheral circuit region 82 (see FIG. 6). Subsequently, color filters (not shown) and microlenses 20 are formed in the image pickup region 81. Furthermore, although the color filter is not shown, the color filter does not cause irregular color since it is possible to ensure a sufficient distance between the image pickup region 81 serving as a lower layer and the peripheral circuit region 82 serving as a higher layer.

(Second Preferred Embodiment)

Figure 7:
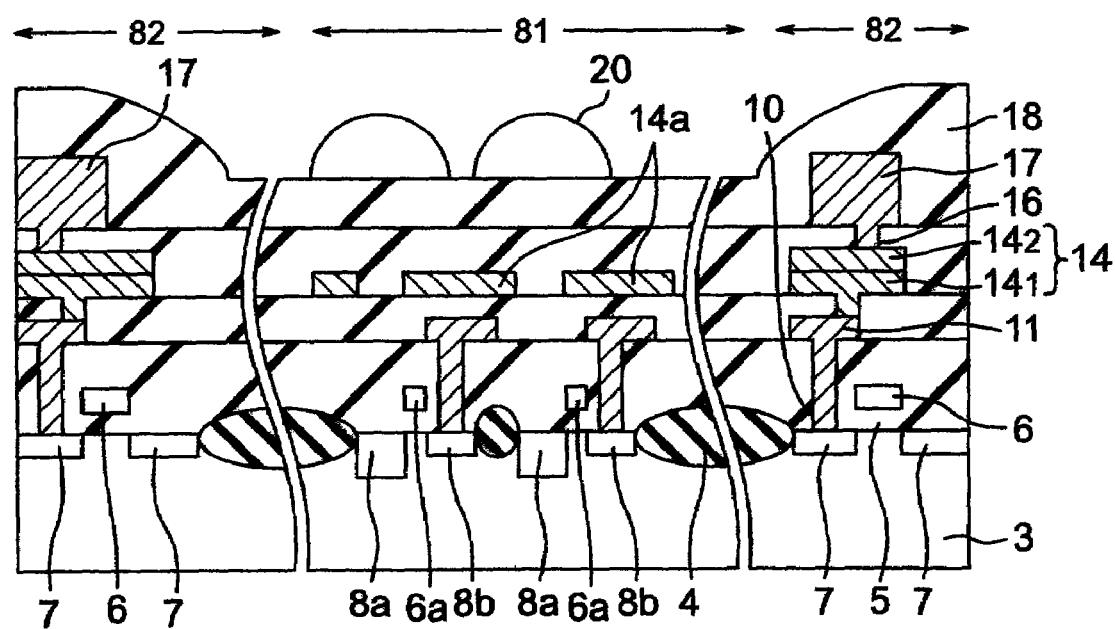
FIG. 7 is a sectional view showing the construction of the second preferred embodiment of an image pickup system according to the present invention.

FIG. 7 shows the construction of the second preferred embodiment of an image pickup system according to the present invention. In the image pickup system in this second preferred embodiment, each the second wiring layers 14 in the peripheral circuit region 82 of the image pickup system in the first preferred embodiment shown in FIG. 1 is replaced with a double-layer structure of a wiring layer 141 and a wiring layer 142, and the thickness of the wiring structure is greater than that in the first preferred embodiment. Furthermore, the wiring layers 141 and shading films 14a are formed in the same layer.

Thus, in this preferred embodiment, the second wiring layer 14 in the peripheral circuit region 82 is thicker than that in the first preferred embodiment, so that it is possible to carry out a more rapid operation. Furthermore, similar to the first preferred embodiment, the image pickup system in the second preferred embodiment can also obtain good image pickup characteristics.

(Third Preferred Embodiment)

Figure 8:
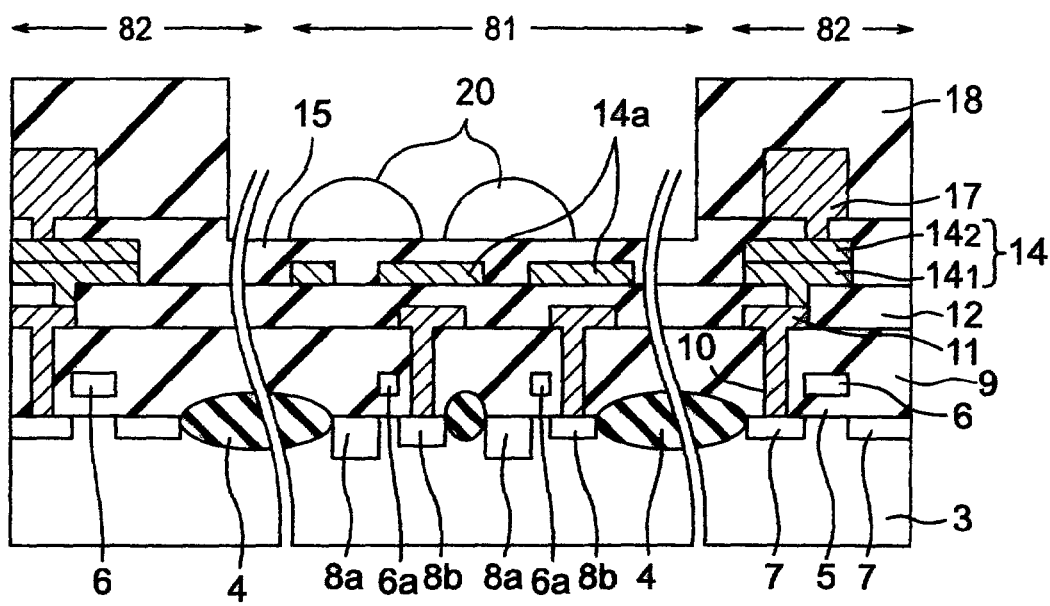
FIG. 8 is a sectional view showing the construction of the third preferred embodiment of an image pickup system according to the present invention.

Referring to FIGS. 8 through 14, the third preferred embodiment of an image pickup system according to the present invention will be described below. FIG. 8 is a sectional view showing the construction of an image pickup system according to the present invention, and FIGS. 9 through 14 are sectional views showing a process for fabricating the image pickup system in this preferred embodiment.

In the image pickup system in this preferred embodiment, the insulating film 18 in the image pickup region 81 of the image pickup system in the second preferred embodiment shown in FIG. 7 is removed, and the flattened insulating film 15 is thinned. In addition, color filter (not shown) and microlenses 20 are formed on the thinned flattened insulating film 15.

Furthermore, in this preferred embodiment, the uppermost insulating film 18 is flattened. In the third preferred embodiment, as compared with the second preferred embodiment, the distance between each of the photoelectric transfer layers 8a and a corresponding one of the microlenses 20 can be a desired distance, so that image pickup characteristics can be further improved without damaging the rapid characteristics of the operation of the peripheral circuit. In addition, since the peripheral circuit region 82 has a triple-layer wiring structure, it is possible to achieve high density integration.

While the insulating film 18 in the image pickup 81 in the second preferred embodiment has been removed and the flattened insulating film 15 in the second preferred embodiment has been thinned, the insulating film 18 in the image pickup region 81 in the first preferred embodiment may be removed and the flattened insulating film 15 in the first preferred embodiment may be thinned.

Referring to FIGS. 9 through 14, a method for fabricating an image pickup system in the third preferred embodiment will be described below.

Figure 9:
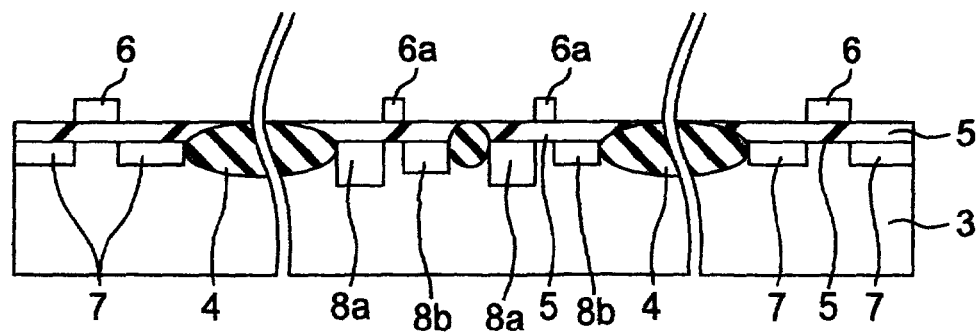
FIG. 9 is a sectional view showing a process for fabricating the third preferred embodiment of an image pickup system according to the present invention.

First, an element isolating region 4 of an insulating film is formed on a semiconductor substrate 3 of, e.g., silicon, to element-isolate an image pickup region 81 from a peripheral circuit region 82 and to isolate elements in the respective regions (see FIG. 9). Thereafter, on the top of the semiconductor substrate in the image pickup region 81 and peripheral circuit region 82, a gate insulating film 5 is formed, and gate electrodes 6 and 6a are formed on the gate insulating film 5 at desired positions (see FIG. 9). Subsequently, as shown in FIG. 9, source and drain regions 7 and diffusion layers 8a, 8b are formed by the ion implantation or the like.

Figure 10:
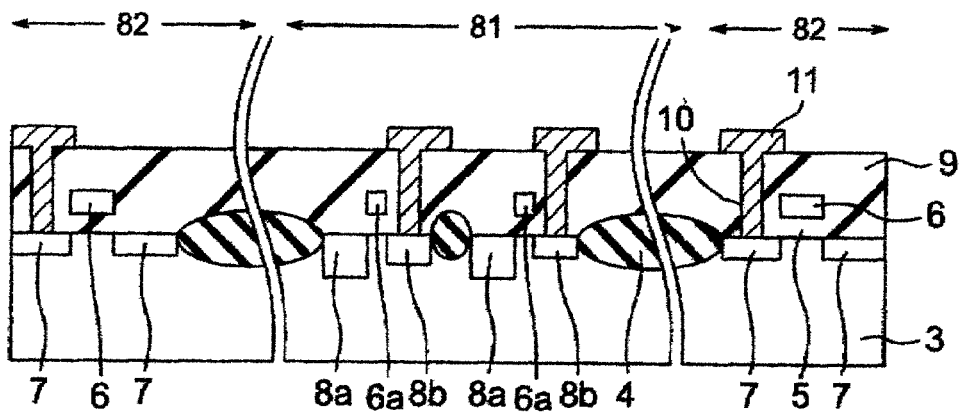
FIG. 10 is a sectional view showing a process for fabricating the third preferred embodiment of an image pickup system according to the present invention.

Then, after an insulating film is deposited on the whole surface of the substrate, the surface thereof is flattened by the CMP to form a flattened insulating film 9 (see FIG. 10). Subsequently, after contact holes 10 communicated with one of each set of the source and drain regions 7 and the diffusion layers 8b are formed in the insulating film 9 using the lithography technique, Al is deposited on the whole surface of the substrate by, e.g., the sputtering method, so as to be filled in the contact holes 10, and patterned to form first wiring layers 11 (see FIG. 10).

Figure 11:
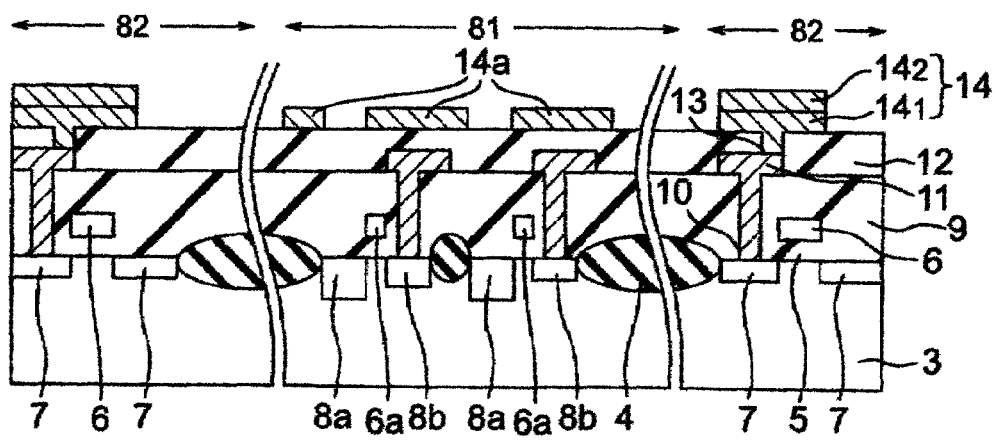
FIG. 11 is a sectional view showing a process for fabricating the third preferred embodiment of an image pickup system according to the present invention.

Then, as shown in FIG. 11, after an insulating film is deposited on the whole surface of the substrate, the surface thereof is flattened by the CMP to form a flattened insulating film 12. Subsequently, after contact holes 13 communicated with the first wiring layers 11 are formed in the insulating film 12 in the peripheral circuit region using the lithography technique, Al is deposited on the whole surface of the substrate so as to be filled in the contact holes 13, and patterned to form second wiring layers 14 and to form shading films 14a on the insulating film 12 in the image pickup region 81 (see FIG. 11). Thereafter, a wiring 142 of Al is formed on a wiring 141 to form a second wiring 14 (see FIG. 11).

Figure 12:
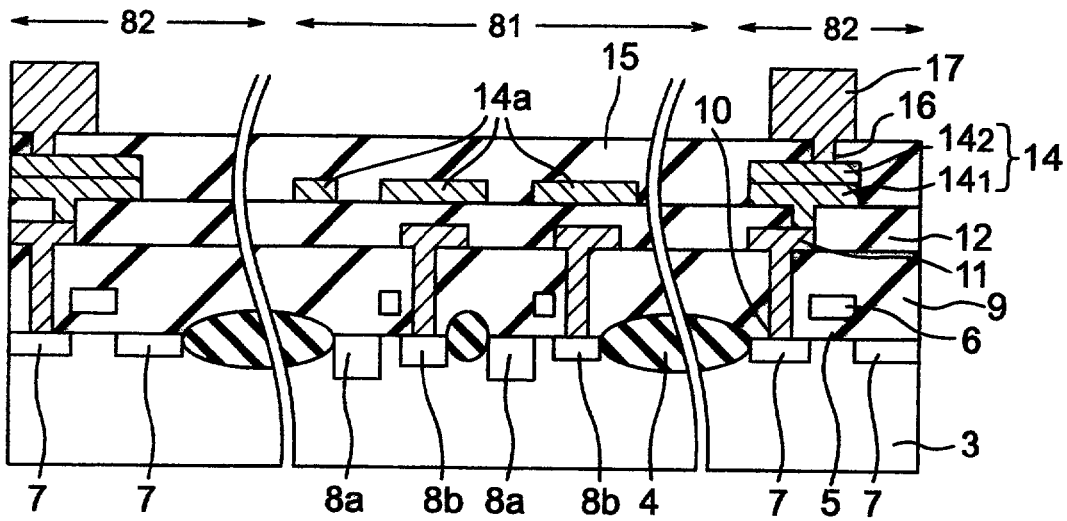
FIG. 12 is a sectional view showing a process for fabricating the third preferred embodiment of an image pickup system according to the present invention.
Figure 13:
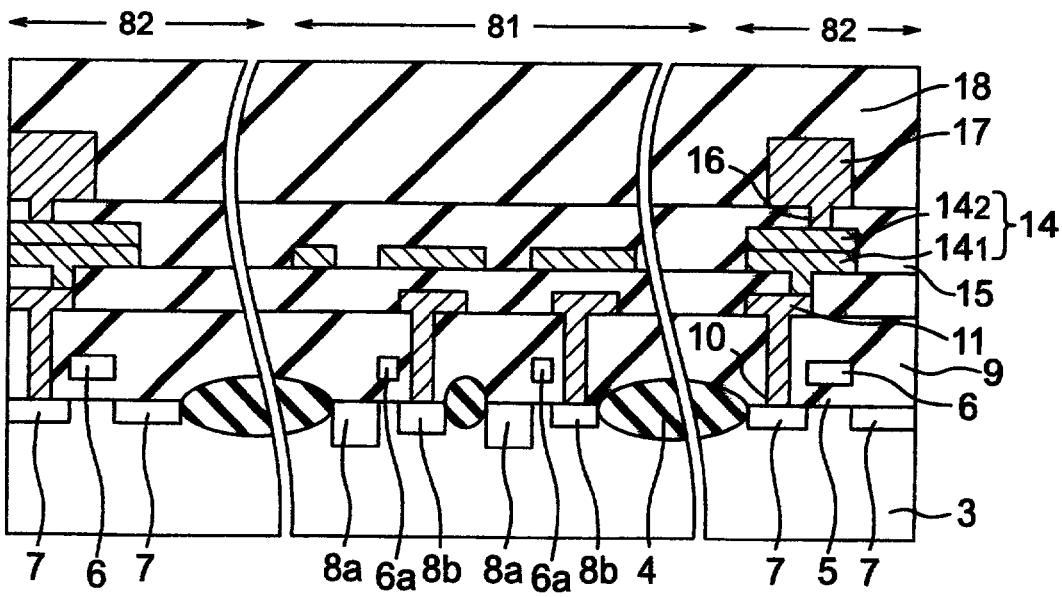
FIG. 13 is a sectional view showing a process for fabricating the third preferred embodiment of an image pickup system according to the present invention.
Figure 14:
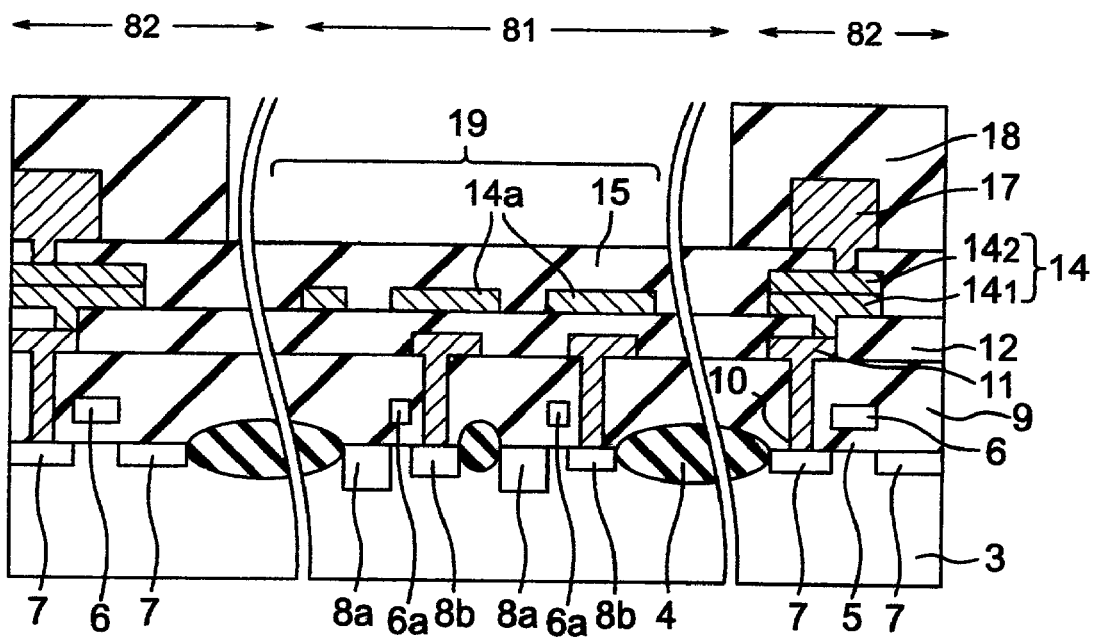
FIG. 14 is a sectional view showing a process for fabricating the third preferred embodiment of an image pickup system according to the present invention.

Then, after an insulating film is deposited on the whole surface of the substrate, the surface thereof is flattened by the CMP to form a flattened insulating film 15 (see FIG. 12). Subsequently, after contact holes 16 communicated with the second wiring layers 14 are formed in the insulating film 15 in the peripheral circuit region using the lithography technique, Al is deposited on the whole surface of the substrate so as to be filled in the contact holes 16, and patterned to form third wiring layers 17 (see FIG. 12). Then, after an insulating film 18 is deposited on the whole surface of the substrate, the surface thereof is flattened by the CMP to form a flattened insulating film 18 (see FIG. 13). Subsequently, a resist pattern (not shown) having holes in the image pickup region 81 is formed using the lithography technique, and the resist pattern is used as a mask to remove the insulating film 18 in the image pickup region 81 (see FIG. 13). At this time, the insulating film 15 may be etched back so that the shading films 14a are not exposed. Thus, an opening 19 is formed in the image pickup region 81 (see FIG. 14).

Then, after the resist pattern is removed, color filters (not shown) and microlenses 20 are formed on the bottom of the opening at predetermined places to complete an image pickup system in the third preferred embodiment.

While the peripheral circuit region 82 has had the triple-layer wiring structure in the first through third preferred embodiments, it may have a multi layer metallization structure of four or more layers.

As described above, according to the present invention, it is possible to obtain good image pickup characteristics and to achieve high density integration and rapid operations.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An image pickup system comprising:
   MOS sensors arranged in an image pickup region of a semiconductor substrate in the form of a matrix and having photoelectric transfer layers;
   a peripheral circuit part formed in a region of said semiconductor substrate except for said image pickup region and having a driving circuit for driving said MOS sensors and a signal processing circuit for processing output signals from said MOS sensors; and
   microlenses, formed to contact with a first insulating film, for condensing picture signals on said photoelectric transfer layers, said first insulating film being formed above said photoelectric transfer layers,
   wherein said driving circuit and said signal processing circuit in said peripheral circuit part are covered by a second insulating film, and the distance between the surface of said first insulating film and said semiconductor substrate is shorter than the distance between the surface of said second insulating film and said semiconductor substrate.

2. An image pickup system as set forth in claim 1, wherein said peripheral circuit part has at least first through third wiring layers which are stacked via an insulating film to form a multi layer metallization structure.

3. An image pickup system as set forth in claim 2, wherein a shading layer is formed in said image pickup region so as to be the same layer as said second wiring layer.

4. An image pickup system as set forth in claim 3, wherein said shading layer has a smaller thickness than that of said second wiring layer.

5. An image pickup system as set forth in claim 1, wherein the distance between each of said microlenses and a corresponding one of said photoelectric transfer layers is substantially equal to the focal length of the corresponding one of said microlenses.

\* \* \* \* \*